(12) United States Patent
Stone (10) Patent No.: US 9,070,739 B2
(45) Date of Patent: Jun. 30, 2015

(54) PACKAGING OR MOUNTING A COMPONENT

(75) Inventor: Kate Stone, Cambridge (GB)

(73) Assignee: Novalia Ltd, Cambridge (GB)

( * ) Notice: Subject to any disclaimer, the term of this patent is extended or adjusted under 35 U.S.C. 154(b) by 484 days.

(21) Appl. No.: 13/386,090

(22) PCT Filed: Jun. 30, 2010

(86) PCT No.: PCT/GB2010/051074
§ 371 (c)(1),
(2), (4) Date: Jan. 20, 2012

(87) PCT Pub. No.: WO2011/010118
PCT Pub. Date: Jan. 27, 2011

(65) Prior Publication Data
US 2012/0117797 A1 May 17, 2012

(30) Foreign Application Priority Data

Jul. 22, 2009 (GB) .................................. 0912742.4

(51) Int. Cl.
*H01L 21/58* (2006.01)
*H01L 23/00* (2006.01)
(Continued)

(52) U.S. Cl.
CPC ............ *H01L 24/75* (2013.01); *Y10T 29/49124* (2015.01); *Y10T 29/5313* (2015.01); *Y10T 29/4913* (2015.01); *H01L 23/4985* (2013.01);
(Continued)

(58) Field of Classification Search
CPC ........ H01L 24/75; H01L 24/97; H01L 33/486
USPC ..................................................... 29/832, 729
See application file for complete search history.

(56) References Cited

U.S. PATENT DOCUMENTS 5,203,143 A 4/1993 Gutentag
5,331,512 A 7/1994 Orton
(Continued)

FOREIGN PATENT DOCUMENTS

DE 10157658 12/2003
GB 2083000 3/1982
(Continued)

OTHER PUBLICATIONS

Machine Translation of Japanese Publication No. 2007-531321 A, published Nov. 1, 2007, Articulated Technologies, LLC (104 pages).
(Continued)

*Primary Examiner* — Livius R Cazan (57) ABSTRACT

A method includes forming a slot in a sheet through a conductive layer thereof, the slot having width in a first direction between first and second edges and length in a second, transverse direction between first and second ends, providing a non-conductive layer on the sheet, the non-conductive layer having at least one window including a first window with length greater than the slot length and width less than the slot width, the first window positioned with respect to the slot such that edges of the first window are inside the edges of the slot and ends of the first window are outside the ends of the slot, placing a component on the conductive layer within the first window so as to bridge the slot and cutting through the sheet and the non-conductive layer along first and second lines outside sides of the component and within the edges the slot.

20 Claims, 10 Drawing Sheets

(51) Int. Cl.
  *H01L 23/498* (2006.01)
  *H01L 33/48* (2010.01)
  *H01L 25/065* (2006.01)

(52) U.S. Cl.
  CPC ....... *H01L 33/486* (2013.01); *H01L 2224/7965* (2013.01); *H01L 2924/01013* (2013.01); *H01L 2924/01027* (2013.01); *H01L 2924/01029* (2013.01); *H01L 2924/01033* (2013.01); *H01L 2924/01051* (2013.01); *H01L 2924/01061* (2013.01); *H01L 2924/01074* (2013.01); *H01L 2924/01079* (2013.01); *H01L 2924/01082* (2013.01); *H01L 2924/14* (2013.01); *H01L 2924/19041* (2013.01); *H01L 2924/19042* (2013.01); *H01L 2924/19043* (2013.01); *H01L 2924/01005* (2013.01); *H01L 2924/01006* (2013.01); *H01L 2924/01021* (2013.01); *H01L 2924/01047* (2013.01); *H01L 24/32* (2013.01); *H01L 24/83* (2013.01); H01L 24/97 (2013.01); *H01L 25/0655* (2013.01); *H01L 2224/32225* (2013.01); *H01L 2224/83191* (2013.01); *H01L 2224/83192* (2013.01); *H01L 2224/97* (2013.01); *H01L 2924/15151* (2013.01); *H01L 2924/12041* (2013.01); *H01L 23/49838* (2013.01); *H01L 2924/1461* (2013.01)

(56) References Cited

U.S. PATENT DOCUMENTS

| | | | |
|---|---|---|---|
| 5,822,191 A | 10/1998 | Tagusa et al. | |
| 6,357,594 B1 | 3/2002 | Gutentag | |
| 2002/0172024 A1* | 11/2002 | Hui et al. | 361/767 |
| 2007/0053310 A1 | 3/2007 | Ishizawa et al. | |
| 2007/0184629 A1 | 8/2007 | Bogner et al. | |
| 2007/0281391 A1 | 12/2007 | Ito et al. | |
| 2008/0246397 A1* | 10/2008 | Wang et al. | 313/512 |

FOREIGN PATENT DOCUMENTS

| | | |
|---|---|---|
| GB | 2177640 | 1/1987 |
| GB | 2453765 | 4/2009 |
| JP | 2005086075 A | 3/2005 |
| JP | 2007531321 A | 11/2007 |
| JP | 2009117754 A | 5/2009 |
| WO | 0008906 | 2/2000 |
| WO | 2005099310 A2 | 10/2005 |

OTHER PUBLICATIONS

Patent Abstracts of Japan, English Abstract, Japanese Publication No. 2009-117754 A, published May 28, 2009, Nakajima Glass Co. Inc. (1 page) plus Machine Translation of same (38 pages).

Patent Abstracts of Japan, Japanese Publication No. 2005-086075 A, published Mar. 31, 2005, Denso Corp., (1 page) plus Machine Translation of same (14 pages).

EPO Machine Translation, DE10157658, 4 pages.

International Preliminary Report on Patentability, mailed Jan. 24, 2012, in parallel International Application No. PCT/GB2010/051074 (8 pages).

\* cited by examiner

PACKAGING OR MOUNTING A COMPONENT

FIELD OF THE INVENTION

The present invention relates to packaging or mounting a component, such as semiconductor chip.

BACKGROUND

A semiconductor chip, such as light emitting diode (LED) chip, is usually packaged in a chip carrier (or "package") or mounted directly to the surface of a printed wiring board (PWB) in order to allow the chip to be connected to other components or devices.

SUMMARY

The present invention seeks to provide a simpler and/or cheaper method of packaging or mounting a semiconductor chip and other types of electronic component.

According to the present invention there is provided a method comprising providing a sheet comprising a conductive layer, forming a slot in the sheet through the conductive layer, the slot having a width in a first direction between first and second edges and length in a second, transverse direction between first and second ends, providing a non-conductive layer on the sheet, the non-conductive layer having at least one window including a first window having a length which is greater than the length of the slot and a width which is less than the width of the slot, the first window positioned with respect to the slot such that edges of the first window are inside the edges of the slot and ends of the first window are outside the ends of the slot, placing a component on the conductive layer within the first window so as to bridge the slot and cutting through the sheet and the non-conductive layer along first and second lines outside sides of the component and within the edges the slot.

Thus, the component can be mounted or packaged using a moving continuous sheet process or other high-volume process which can be carried out using printing and/or converting processes which can help to reduce the cost of mounting or packaging the component.

Providing the sheet may comprise providing a flexible sheet.

Providing the sheet may comprise providing a sheet of conductive material and the conductive layer is the sheet of conductive material.

Providing the sheet may comprise providing a sheet which comprises a non-conductive substrate and the conductive layer, wherein the substrate has a face and an opposite face and the conductive layer is supported on the face of the substrate, wherein forming the slot in the sheet comprises providing a slot in the sheet through the conductive layer and the non-conductive substrate, wherein providing the non-conductive layer on the sheet comprises providing the non-conductive layer on the conductive layer, wherein placing the component on the sheet comprises placing a component on the conductive layer. The non-conductive substrate may comprise a plastics material, such as polyethylene terephthalate (PET). The non-conductive substrate may have a thickness of about 10 µm to about 500 µm, preferably about 100 µm.

The conductive layer may comprise a metal, such as aluminium. The conductive layer may be patterned. The conductive layer comprises a plurality of parallel strips of conductive material. The method may comprise patterning the conductive layer on the non-conductive substrate.

The method may further comprise applying a conductive adhesive to the conductive layer.

The non-conductive layer may have second and third windows, wherein the first window is disposed between the second and third windows.

The method may comprise providing a second non-conductive layer on the non-conductive layer, wherein the second non-conductive layer covers the first window.

The method may further comprise providing a third non-conductive layer on the opposite face of the substrate, wherein the third non-conductive layer covers the slot.

The component may be an optoelectronic component, such as a light-emitting diode chip.

According to a second aspect of the present invention there is provided an apparatus configured to perform the method.

According to a third aspect of the present invention there is provided an apparatus comprising means for providing a sheet, the sheet comprising a conductive layer, means for forming a slot in the sheet through the conductive layer, the slot having a width in a first direction between first and second edges and length in a second, transverse direction between first and second ends, means for providing a non-conductive layer on the conductive layer, the non-conductive layer having at least one window including a first window having a length which is greater than the length of the slot and a width which is less than the width of the slot, the first window positioned with respect to the slot such that edges of the first window are inside the edges of the slot and ends of the first window are outside the ends of the slot, means for placing a component on the conductive layer within the first window so as to bridge the slot and means for cutting through the sheet and the non-conductive layer along first and second lines outside sides of the component and within the edges of the slot.

The sheet providing means may include a roll configured to pay out the sheet or a single sheet feeder. The slot forming means may comprise a rotary die cutting roller or a laser. The non-conductive layer providing means may comprise rollers configured to laminate the non-conductive layer and the sheet. The component placing means may comprise a carrier sheet supporting the component and rollers configured to transfer the component from the carrier sheet onto the sheet or a pick-and-place robot. The cutting means may comprise a rotary die cutting roller or a laser.

According to a fourth aspect of the present invention there is provided an apparatus comprising a sheet feeder or roller configured to provide a sheet comprising a conductive layer, a first punch, cutter or laser configured to form a slot in the sheet through the conductive layer, the slot having a width in a first direction between first and second edges and length in a second, transverse direction between first and second ends, a laminator configured to provide a non-conductive layer on the sheet on the conductive layer, the non-conductive layer having at least one window including a first window having a length which is greater than the length of the slot and a width which is less than the width of the slot, the first window positioned with respect to the slot such that edges of the first window are inside the edges of the slot and ends of the first window are outside the ends of the slot, an applicator configured to place a component on the sheet on the conductive layer within the first window so as to bridge the slot and a second punch, cutter or laser configured to cut through the sheet and the non-conductive layer along first and second lines outside sides of the component and within the edges of the slot.

The applicator may be a pick-and-place robot.

According to a fifth aspect of the present invention there is provided a device comprising first and second opposite edges, first and second coplanar conductive sheet portions lying between the first and second edges of the device, separated by a slot running in a first direction between the first and second edges of the device, the slot having a length in a second, transverse direction between first and second slot ends, a non-conductive layer bridging the slot, the non-conductive layer having at least one window including a first window having a length which is greater than the length of the slot, the first window positioned with respect to the slot such that edges of the first window are inside the edges of the device and ends of the first window are outside the ends of the slot and a component supported on the conductive sheet portions within the first window so as to bridge the slot.

The device may further comprise non-conductive sheet portions supporting the coplanar conductive sheet portions. The conductive sheet portions and the non-conductive sheet portions may be coextensive. The device may further comprise a non-conductive layer support supporting the conductive sheet portions.

According to a sixth aspect of the present invention there is provided a packaged component comprising the device.

BRIEF DESCRIPTION OF THE DRAWINGS

Some embodiments of the present invention will now be described, by way of example, with reference to the accompanying drawings in which:

FIGS. 6A to 6D are plan views of a second modified structure device at certain stages during fabrication;

DETAILED DESCRIPTION OF EMBODIMENTS

Figure 1:
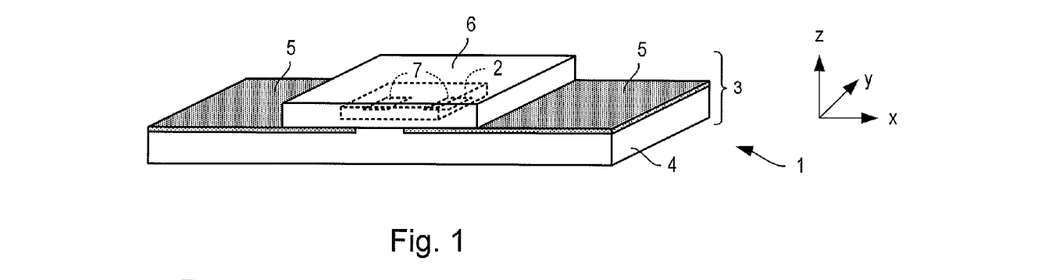
FIG. 1 is a simplified, perspective view of a packaged component.

FIG. 1 illustrates an example of a packaged electronic component or device 1 (herein referred to simply as the "packaged component"). The packaged component 1 includes an electronic component or device 2 (herein referred to simply as the "component") and a package 3. In this example, the component 2 is a light emitting diode (LED) chip (or "die").

The package 3 includes a support 4, an appropriate number of contact pads 5 and a protective cover 6. A contact pad 5 may be provided for each terminal 7 of the component 2. In this example, there are two contact pads.

The packaged component 1 may be fabricated using only simple process steps, such as cutting and laminating. Thus, the packaged component 1 can be cheaply fabricated using high-volume production techniques, such as a moving continuous flow process.

Figure 2:
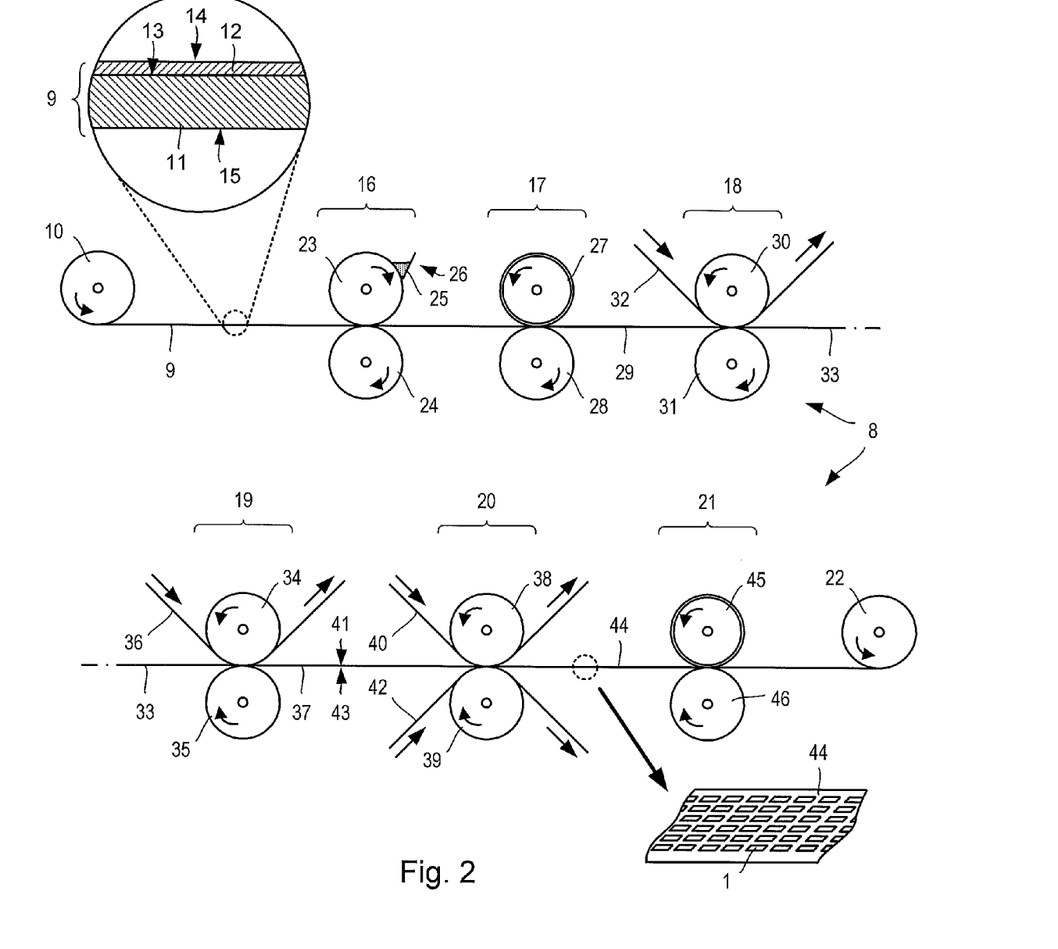
FIG. 2 is a schematic diagram of a moving continuous sheet process.

Referring also to FIG. 2, an example of apparatus 8 which can be used to fabricate the packaged component 1 is shown. As shown in FIG. 2, the apparatus 8 is based on a moving continuous flow process.

A sheet (or "web") of metallized film 9 is wrapped around an unwind roller 10. The sheet 9 is flexible and comprises a non-conductive substrate 11 and a thin layer 12 of metallization supported on one side 13 (herein defined as the "upper surface"). The metallization layer 12 has an upper surface 14. The substrate 11 has a lower surface 15. In this example, the metallization layer 12 covers the substrate 11.

The sheet 9 is paid out from the unwind roller 10 and passes through a series of workstations 16, 17, 18, 19, 20, 21 to produce an array of packaged components 1 which can be wound onto a take-up roller 22.

A first workstation 16 may include, for example, a gravure cylinder 23 and a corresponding counter impression roller 24 which is used to apply a conductive adhesive 25 from a source 26 over the metallization 12. A printing process, such as gravure, need not be used. Instead, a laminating process may be used to apply, for example, an anisotropic conductive film to the metallization 12.

A second workstation 17 may include, for example, a rotary die cutting roller 27 and a counter impressing roller 28. As will be explained later, this can be used to produce an adhesive-coated perforated sheet 29.

A third workstation 18 may include, for example, a pair of laminating rollers 30, 31 which laminates the adhesive-coated perforated sheet 29 and another perforated sheet 32 to produce a recessed laminated sheet 33.

A fourth workstation 19 may include, for example, a pair of rollers 34, 35 to transfer components 2 from a carrier sheet 36 onto the recessed sheet 33 to produce a recess-filled laminated sheet 37. An alternative form of applicator and transfer process can be used, such as a robot for "picking-and-placing" components.

A fifth workstation 20 includes a pair of laminating rollers 38, 39 which laminates the recess-filled laminated sheet 39 with another perforated sheet 40 on a top side or face 41 of the sheet 39 and with a sheet 42 on the bottom side 43, to produce a laminated sheet 44. This process may be divided into two separate processes, i.e. the sheet 39 may be laminated with each sheet 40, 42 separately.

A sixth workstation 21 may include, for example, a rotary die cutting roller 45 and a counter impressing roller 46 for cutting the sheet 44 into separate packaged components 1, which may be still connected to the sheet at its corners. The sheet may be cut along its length into rows or threads of components 1.

The packaged components 1 may be transferred onto another sheet (not shown) which is then wound onto the take-up roller 22, for example by using a transfer roller.

As explained earlier, the packaged component 1 may be fabricated using the apparatus 8 shown in FIG. 2. However, other arrangements and other types of manufacturing process can be used. For example, a sheet feed process can be used in which single planar sheets are processed. This type of process may be used if the sheet is sufficiently rigid.

Referring to FIGS. 2, 3A to 3H and 4A to 4H, a method of fabricating a packaged component 1 (FIG. 1) or a circuit or device including the component 2 will now be described.

Figure 3A:
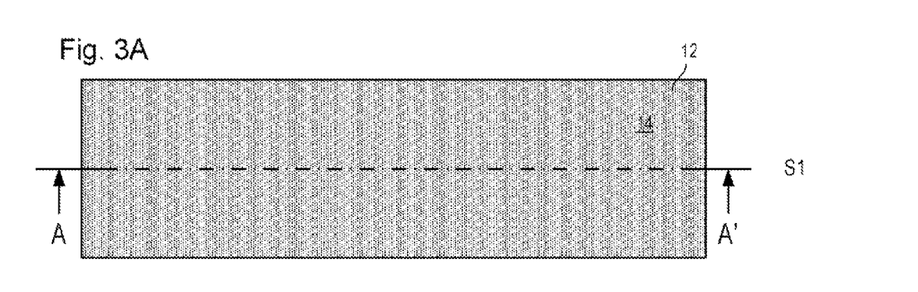
FIGS. 3A to 3H are plan views of a device at different stages during fabrication.
Figure 4A:
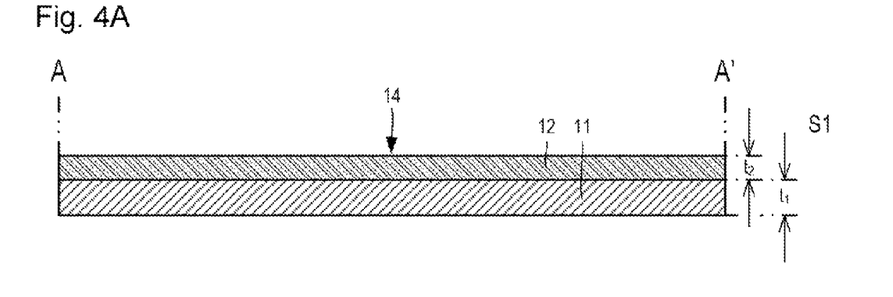
FIGS. 4A to 4H are cross sectional views of the components shown in FIGS. 3A to 3H respectively, taken along a line A-A' at different stages during packaging.

Referring in particular to FIGS. 3A and 4A, a sheet of laminate 9 is prepared by providing a conductive layer 12 on one side 13 of a non-conductive substrate 11. In some embodiments, a conductive sheet, e.g. a sheet of foil, is used which may not be supported on a substrate.

The substrate 11 comprises a plastic, such as polyethylene terephthalate (PET). The substrate 11 need not be plastic, but may comprise, for example, stiff paper or card. The substrate 11 has a thickness, $t_1$, typically in the range between about 10 μm and about 500 μm, for example about 100 μm. Preferably, the substrate is about the thickness of the component 2 or thicker than the component 2.

Preferably, the material forming the substrate 11 and the thickness of the substrate 11 are such that the laminate 9 is flexible. However, the laminate 9 can, in some embodiments, be rigid.

The conductive layer 12 comprises a metal, such as aluminum. Other metals, such as gold or copper, or metal alloys can be used. The conductive layer 12 can be applied by moving vacuum metallization process.

The laminate 9 can be formed by bonding a sheet of conductive material (e.g. a sheet of foil) with a sheet of non-conductive material. The conductive layer 12 may be glued to the substrate 11. The conductive layer 12 is thinner than the substrate and has a thickness, $t_2$, typically in the range between about 10 to 100 nm, for example about 40 nm, for a metallization applied using a vacuum metallization process. The conductive layer 12 may be thicker, for example about 1 μm or 10 μm or more, for instance, if a sheet of foil is used without a supporting substrate.

In this example, only one surface 13 of the substrate 11 is provided with a conductive layer 12. However, the other side 15 may also have a conductive layer (not shown).

The conductive layer 12 is not patterned and covers the substrate 11. However, as will be explained later, the conductive layer 12 need not be continuous, but can be patterned. This can be used to fabricate more than two contact pads 5 (FIG. 1) and/or interconnect more than one component. For example, more than one LED die can be mounted and interconnected via a patterned conductive layer 12 and so produce a multi-segment LED display.

Figure 3B:
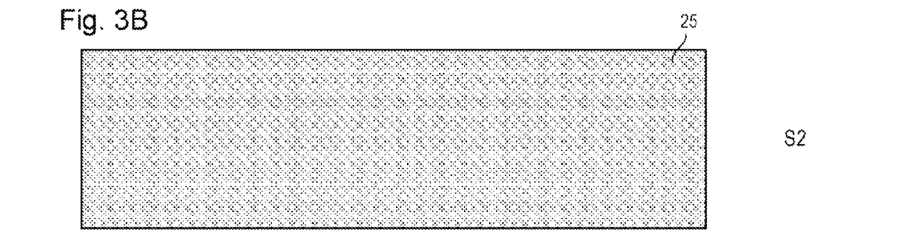
Figure 4B:
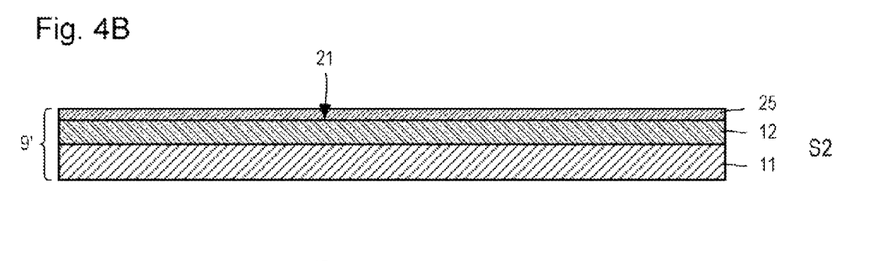

Referring now to FIGS. 3B and 4B, a conductive adhesive 25 is applied to the upper surface 14 of the conductive layer 12 (step S2).

The adhesive 25 is also not patterned and covers the conductive layer 12. However, the adhesive 25 may be patterned and/or need not cover the entire conductive layer 12. For example, the adhesive 25 may be patterned by applying the adhesive 25 to selective areas of the conductive layer 12 or, if the conductive layer 12 is patterned, to selective areas of the conductive layer 12 and substrate 11, using a printing process. Alternatively, the adhesive 25 may be patterned by applying the adhesive 25 to the conductive layer 12 or, if the conductive layer 12 is patterned, the conductive layer 12 and substrate 11, and subsequently removing areas of the adhesive 25.

The adhesive 25 takes the form of a conductive paste or glue, such as a silver- or carbon-filled adhesive. The adhesive 25 may be an anisotropic conductive paste. Preferably, the adhesive 25 is pressure-sensitive, i.e. sets under pressure. However, a pressure-sensitive adhesive need not be used.

As explained earlier, the conductive adhesive 25 may take the form of a tape or film, such as anisotropic conductive film.

Figure 3C:
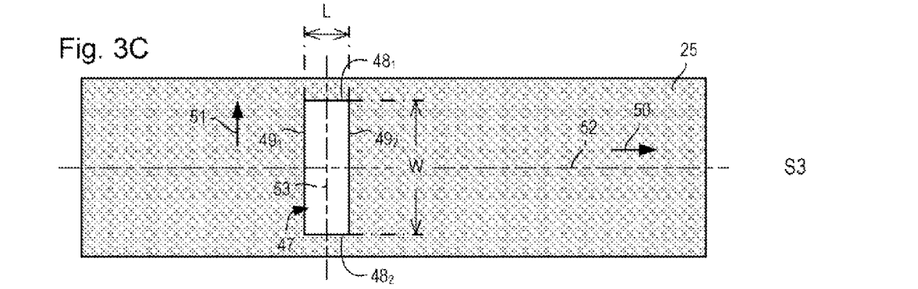
Figure 4C:
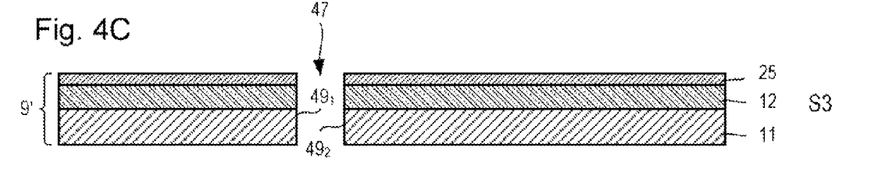

Referring now to FIGS. 3C and 4C, a slot 47 is cut, e.g. by rotary die cutting or laser cutting, through the adhesive-coated conductive layer 12 and substrate 11. The slot 47 is generally rectangular having four edges, namely first and second sides $48_1$, $48_2$ and first and second ends $49_1$, $49_2$.

The slot 47 has a length, L, in a first direction 50 (herein defined along the x-axis) and a width, W, in a second, orthogonal direction 51 (herein defined along the y-axis). The width, W, of the slot 47 is greater than its length, L.

A medial line 52 is defined as running through the slot 47 midway between the first and seconds sides 481, 482. Likewise, a transverse line 53 is defined as running through the slot 47 midway between the first and seconds sides $48_1$, $48_2$.

The slot length, L, is less than the length, $l_c$, of the (suitably-orientated) component 2 which will be placed over the slot 47. The amount of overlap may depend on the location of the terminal and/or minimum area of contact required between the component and the underlying surface. For example, the area may be limited by contact resistance or by force needed to secure the component.

The slot width, W, is greater than the width, $w_c$, of the intended component 2. The slot width, W, also depends on parameters associated with subsequent processing, in particular cutting line width and tolerance.

Taking the example of an LED chip which has a length, $l_c$, of about 300 μm and a width, $w_c$, of about 200 μm, the slot length, L, may be, for example, about 100 to 200 μm and the slot width, W, may be, for instance, about 350 μm to about 450 μm or more.

Slots (not shown) may also be cut, for example close to the edges of the sheet 9' so as to provide registration for subsequent process steps.

Figure 3D:
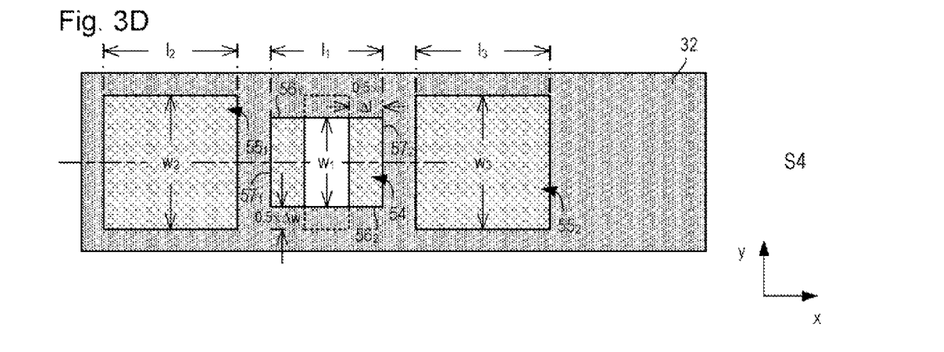
Figure 4D:
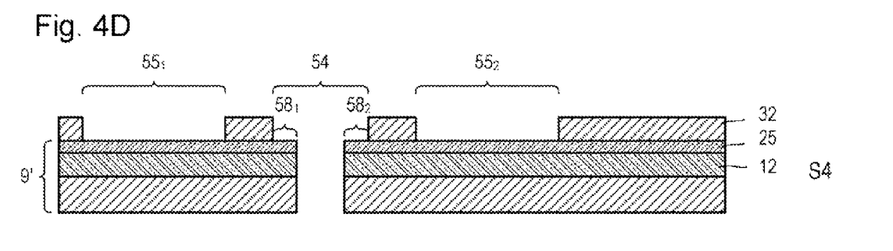

Referring also to FIGS. 3D and 4D, a first additional non-conductive layer 32 is provided on the adhesive-coated conductive layer 12. The first additional layer 32 may comprise the same material as the substrate 11, for example, PET.

The first additional layer 32 includes, for each intended component 2, a set of windows 54, $55_1$, $55_2$.

The windows 54, $55_1$, $55_2$ are arranged in line in the first direction 50 such that a first window 54 is disposed between second and third windows $55_1$, $55_2$. The windows 54, $55_1$, $55_2$ are rectangular with the first window 54 being slightly smaller than its neighbouring windows $55_1$, $55_2$.

Each window 54, $55_1$, $55_2$ is disposed on the medial line 52 running through the middle of the slot 47 so that each window 54, $55_1$, $55_2$ is symmetric about the medial line 52, i.e. centered on and about the medial line 52. The windows 54, $55_1$, $55_2$ are also arranged about the transverse line 53 so that the set of windows 54, $55_1$, $55_2$ are symmetrically arranged about the transverse line 53.

The first window 54 is narrower than the slot 47 and the second and third windows $55_1$, $55_2$. The first window 54 has a width, $w_1$, which is less than the slot width, W, by a width difference, Δw. The sides $56_1$, $56_2$ of the first window 54 lie inside the sides $48_1$, $48_2$ of the slot 47.

The first window 54 is longer than the slot 47. The first window 54 has a length, $l_1$, which is greater than the slot length, L, by a length difference, Δl. The ends $57_1$, $57_2$ of the first window 54 lie outside the ends $49_1$, $49_2$ of the slot 47.

The first window 54 provides a recess which can accommodate the component 2 and, as will be explained later, the component 2 sits in the recess spanning the slot 47. The first window 54 leaves first and second area $58_1$, $58_2$ of the adhesive-coated conductive layer 12 uncovered on which the component 2 will rest and which provide contact.

Figure 3E:
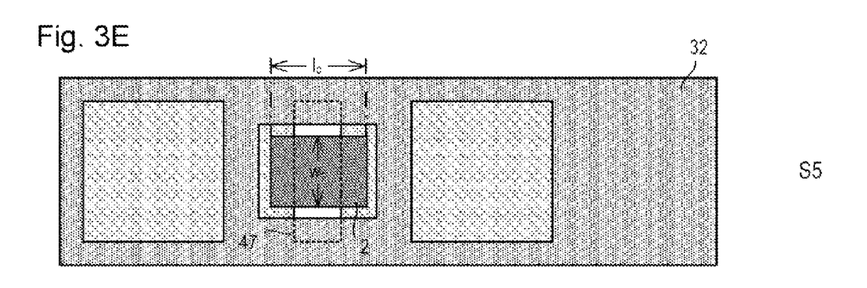
Figure 4E:
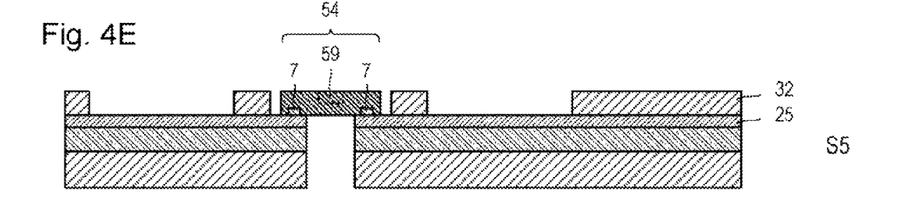

Referring now to FIGS. 3E and 4E, the component 2 is placed inside the first window 54, sitting on the contact areas 581, 582 and spanning the slot 47. If a pressure-sensitive adhesive 47 is used, then pressure is applied to the component 2 to set the adhesive 25. If an adhesive requires curing, then the sheet may be heated or irradiated.

The component 2 may be orientated so that a functional region or surface 59, e.g. light-emitting surface, is arranged on top, i.e. away from the sheet.

Figure 3F:
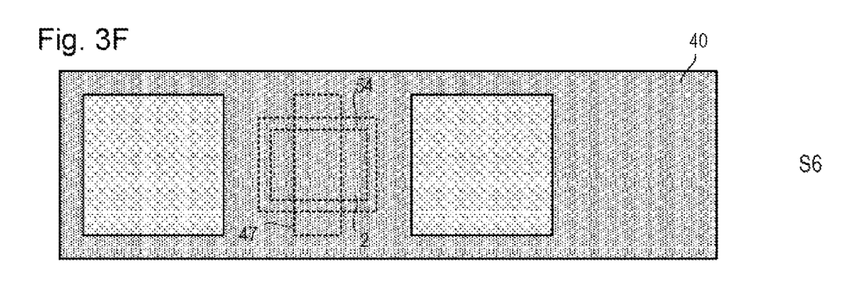
Figure 4F:
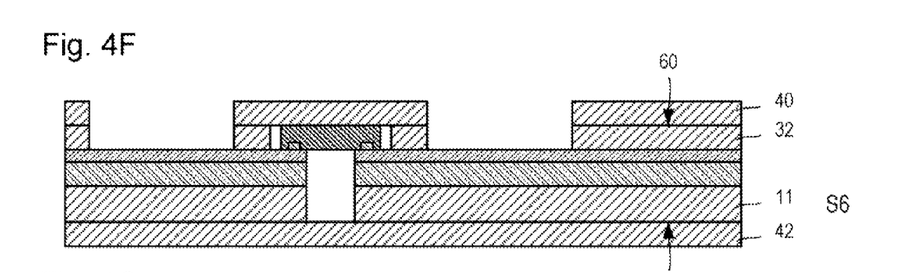

Referring now to FIGS. 3F and 4F, a second additional non-conductive layer 40 is provided on an upper surface 60 of the first additional layer 32. The second additional layer 40 may also comprise PET.

The second additional layer 40 has a similar pattern as the first additional layer 32 except that the first window 54 is omitted. Thus, the second additional layer 40 covers the component 2 and bridges the underlying first window 54. As will be explained in more detail later, this helps to provide mechanical support.

A third additional non-conductive layer 42 is also provided on the opposite side, i.e. the opposite side of the substrate 11. The third additional layer 42 may also comprise PET.

The third additional layer 42 is un-patterned. Thus, the third additional layer 42 spans the slot 47. This too can help to provide mechanical support.

At this point, the component 2 is encapsulated. However, the terminals 7 of the component are electrically shorted through the conductive layer 12.

Figure 3G:
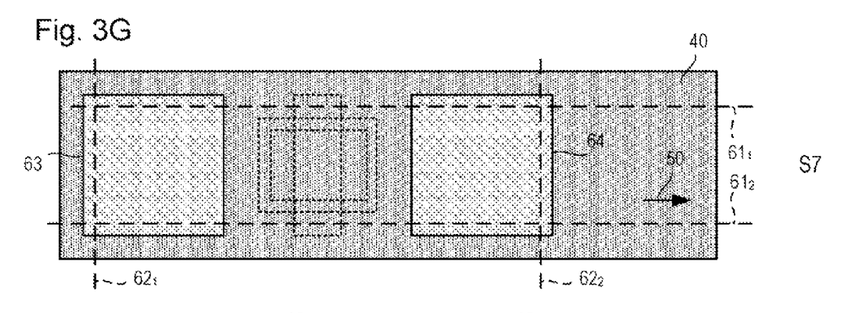
Figure 3H:
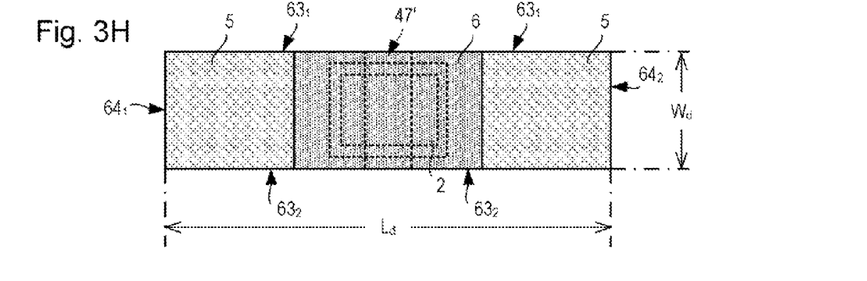
Figure 4G:
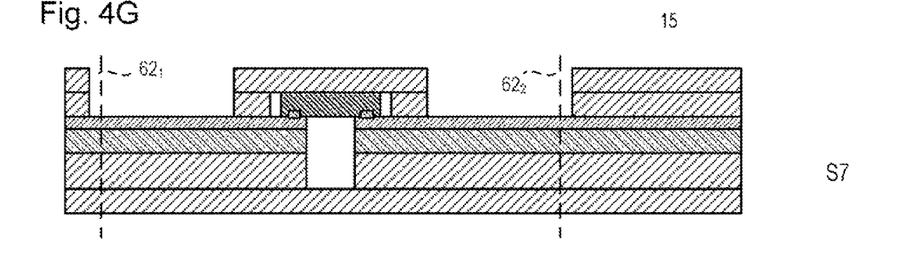
Figure 4H:
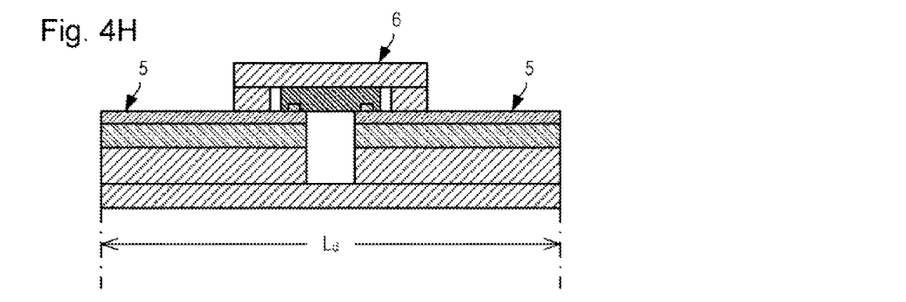

Referring now to FIGS. 3G and 4G, first and second cuts $61_1$, $61_2$ are made along the first direction 50 so as to isolate different parts of the conductive layer 12. The first and second cuts $61_1$, $61_2$, together with third and fourth cuts $62_1$, $62_2$ made along the second direction 51 within the outer ends of the second and third windows 63, 64, isolate the component 2 from other components (not shown) and define the packaged component 1 as shown in FIGS. 3H and 4H.

The packaged component 1 has a length L, between first and second ends $63_1$, $63_2$ and a width $W_D$ between first and second edges $64_1$, $64_2$.

The length of the first and second cuts, $61_1$, $61_2$ may be slightly less than $L_D$ and/or the length of the third and fourth cuts $62_1$, $62_2$ may be slightly less than $W_D$ so as leave the packaged component 1 attached to the sheet. The cuts $61_1$, $61_2$, $62_1$, $62_2$ may take the form of slots (not shown) and so inner edges (not shown) of the cuts $61_1$, $61_2$, $62_1$, $62_2$ define the length and width of the device.

The first and second cuts $61_1$, $61_2$ result in a slot or void 47' which spans the width of the packaged component 1 and, thus, divides the sheet 9 (and each layer forming the sheet) into first and second separate coplanar portions.

As described earlier, the component 2 may have two terminals 7. However, some components may have three or more terminals, such as a transistor, an integrated circuit or multi-component module.

The apparatus and processes hereinbefore described can be modified to package or mount components having more than two terminals.

FIGS. 5A, 5B, 5C and 5D show selected modified steps illustrating a process for packaging or mounting a four-terminal component.

Figure 5A:
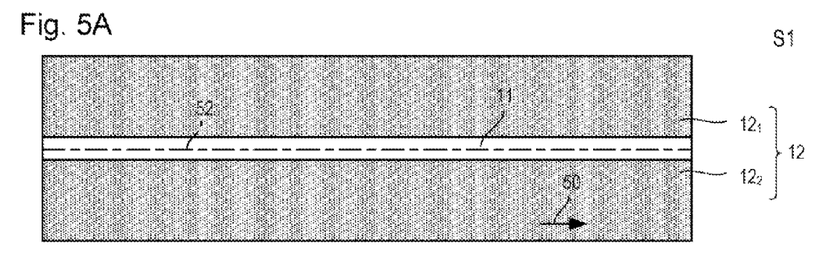
FIGS. 5A to 5D are plan views of a first modified structure device at certain stages during fabrication.

As shown in FIG. 5A, the conductive layer 12 is patterned to provide strips or tracks $12_1$, $12_2$ of conductive material running along the first direction 50 either side of the medial line 52 and separated by a gap. Thus, the conductive strips $12_1$, $12_2$ are isolated from each other. The tracks $12_1$, $12_2$ may be formed by patterning the conductive layer using a mask (not shown) and etching unwanted areas of conductive layer. Alternatively, a hot foil stamping process can be used to selectively apply the strips $12_1$, $12_2$ to the substrate 11. The gap between the tracks may be discontinuous. For example, the gap may occur only along the length of the packaged component 1. Thus, while the tracks may not be isolated from each other on the sheet, the tracks within a packaged component 1 are separated once the sheet is cut and the packaged components 1 are removed from the sheet.

Figure 5B:
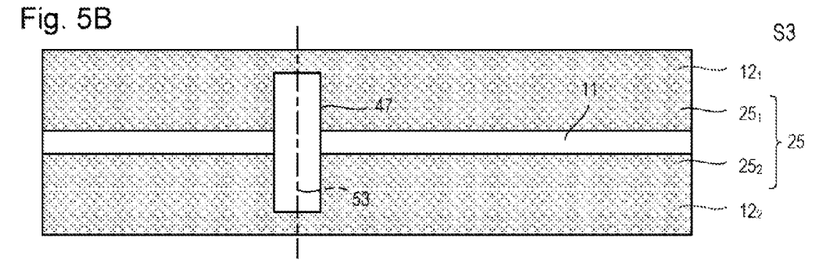

As shown in FIG. 5B, a co-extensive pattern of conductive adhesive $25_1$, $25_2$ is applied over the conductive tracks $12_1$, $12_2$ so that there are strips $25_1$, $25_2$ of adhesive. The process is then continued as described earlier. In particular, a slot 47 is cut which passes from the one track $12_1$, $12_2$ to another.

Figure 5C:
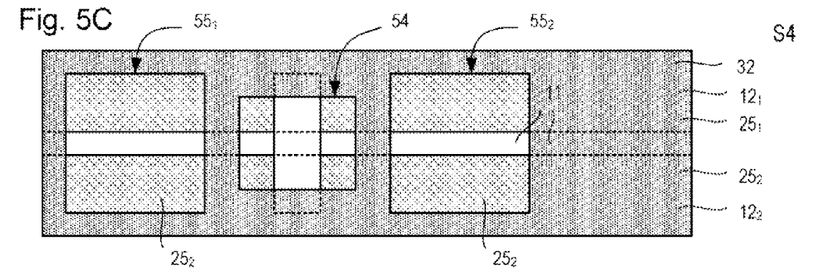

As shown in FIG. 5C, the second additional layer 32 is applied having the same arrangement of windows 54, $55_1$, $55_2$ as hereinbefore described. However, a different window arrangement can be used. For example, two pairs of windows (not shown) can be used in place of the two windows $55_1$, $55_2$.

Figure 5D:
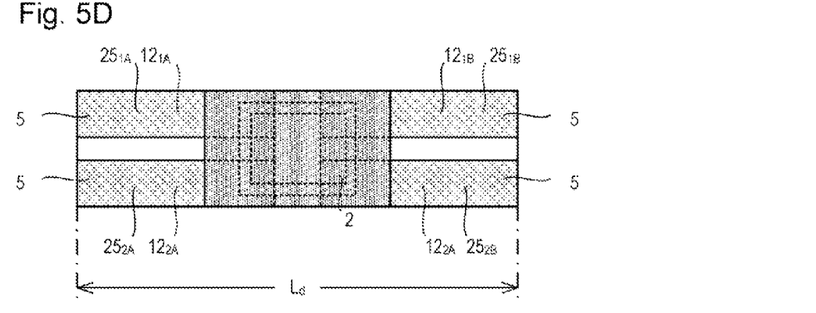

As shown in FIG. 5D, cutting the lines to define the outline of the packaged device results in each strip $12_1$, $12_2$ being divided into two parts, $12_{1A}$, $12_{1B}$, $12_{2A}$, $12_{2B}$ by the slot 47. Thus, four separate contact pads 5 can be defined.

The use of strips or tracks can be used to define more than four contact pads.

Figure 6A:
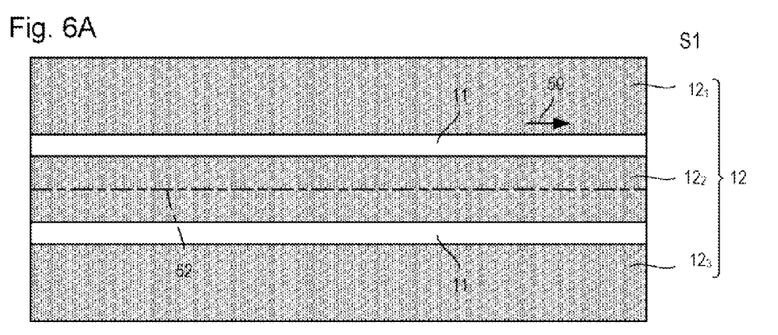
Figure 6B:
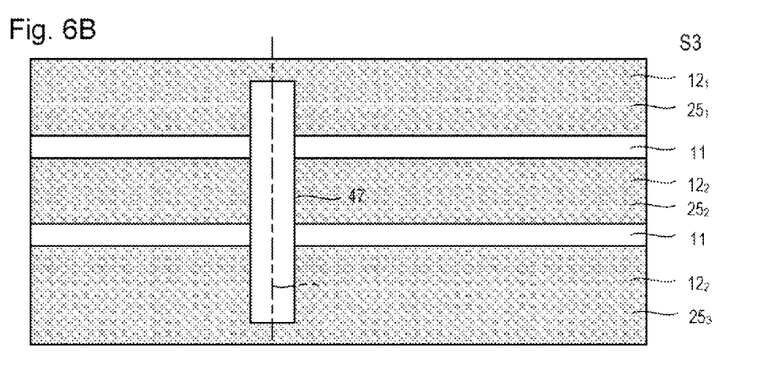
Figure 6C:
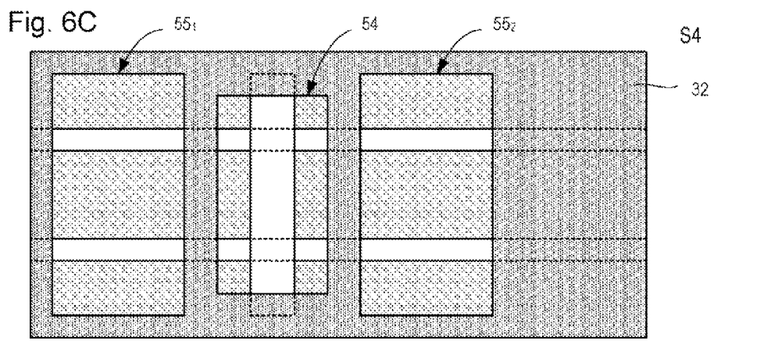

FIGS. 6A, 6B and 6C show selected modified steps illustrating a process for packaging or mounting a six-terminal component.

As shown in FIG. 6A, the conductive layer 12 is patterned to provide three strips or tracks $12_1$, $12_2$, $12_3$ of conductive material running along the first direction 50. The centre of the central strip 122 runs along the medial line 52. The conductive strips $12_1$, $12_2$, $12_3$ are isolated from each other. As shown in FIG. 6B, a slot 47 is cut which passes from the one track $12_1$ across an intermediate track $12_2$ to another track $12_3$. The slot 47 can be made wider. As shown in FIG. 6C, the second additional layer 32 is applied having a similar arrangement of windows 54, $55_1$, $55_2$ as that described earlier, except that the windows are wider.

It will be appreciated that the process can be extended to make eight, ten, twelve, fourteen or more contact pads.

The number of contact pads need not be an even number. FIGS. 7A, 7B, 7C and 7D show selected modified steps illustrating a process for packaging or mounting a three-terminal component.

Figure 7A:
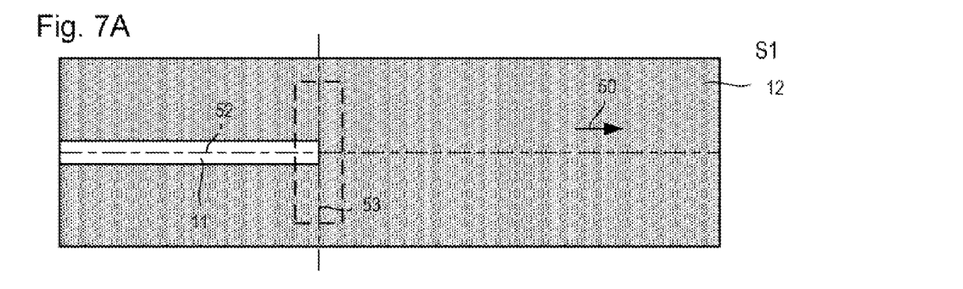
FIGS. 7A to 7D are plan views of a third modified structure device at certain stages during fabrication.
Figure 7B:
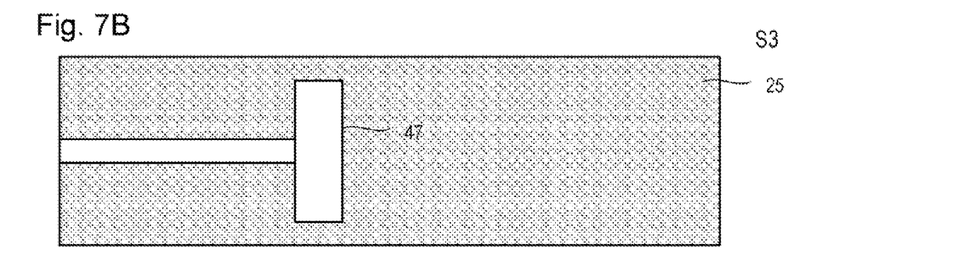
Figure 7C:
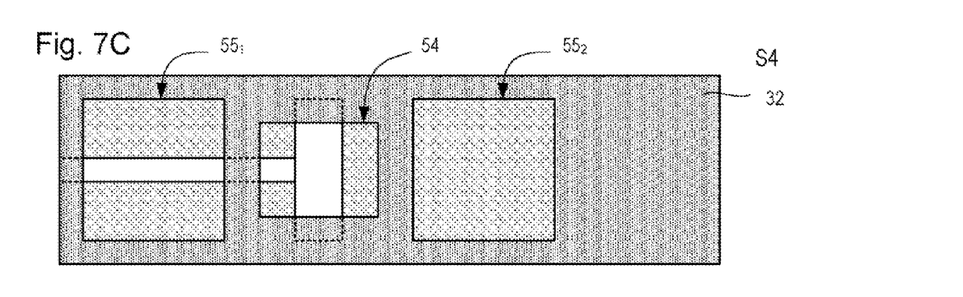
Figure 7D:
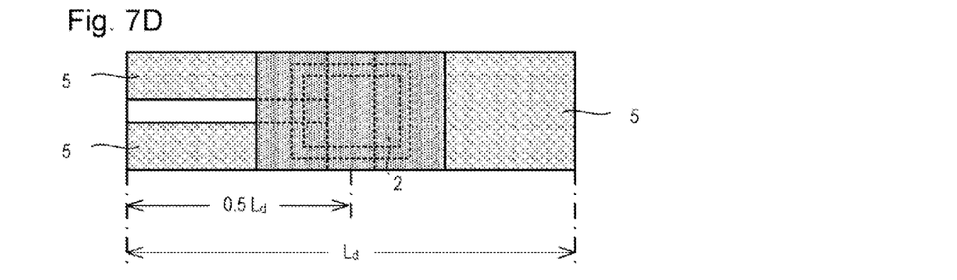
Figure 8A:
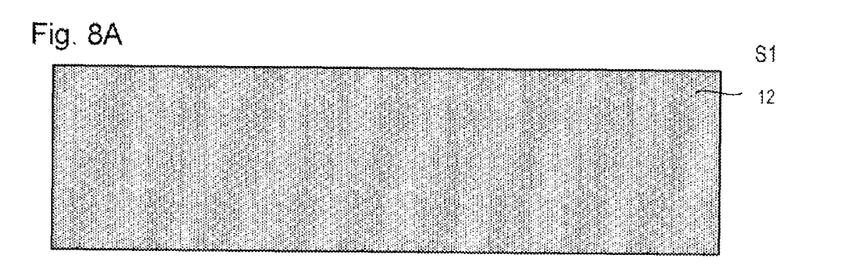
FIGS. 8A to 8D are plan views of a fourth modified structure device at certain stages during fabrication.
Figure 8B:
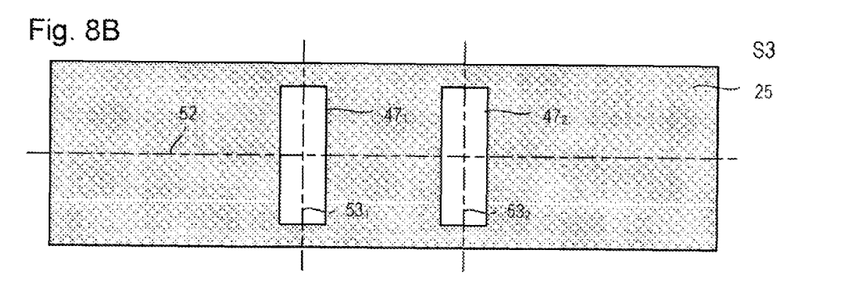
Figure 8C:
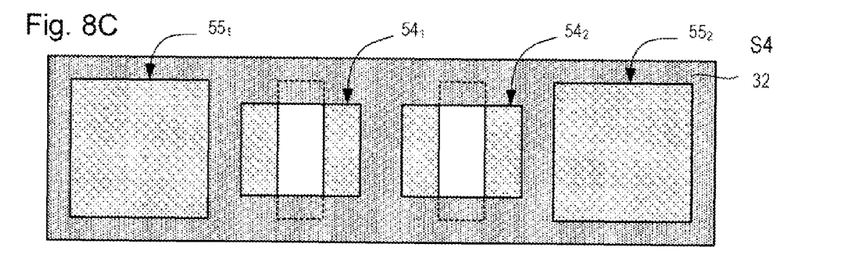
Figure 8D:
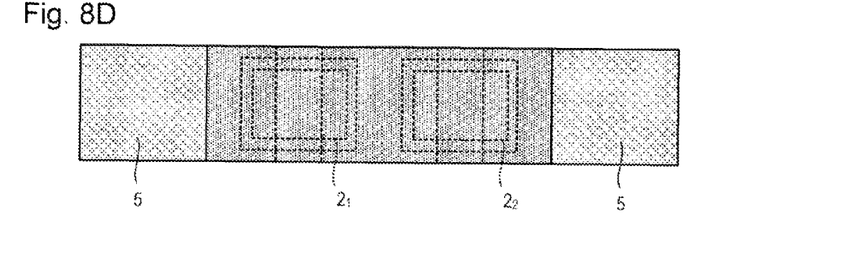
Figure 9A:
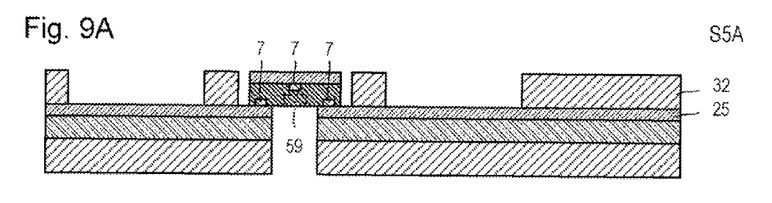
FIGS. 9A and 9B are cross-sectional views of a fifth modified structure at certain stages during fabrication.
Figure 9B:
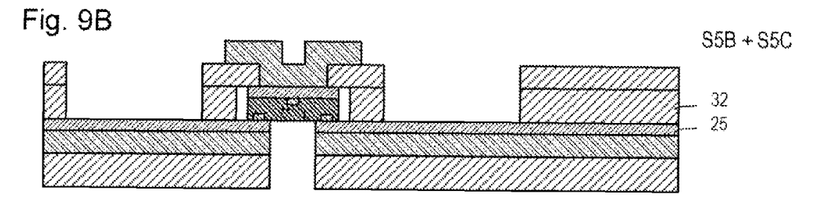
Figure 9C:
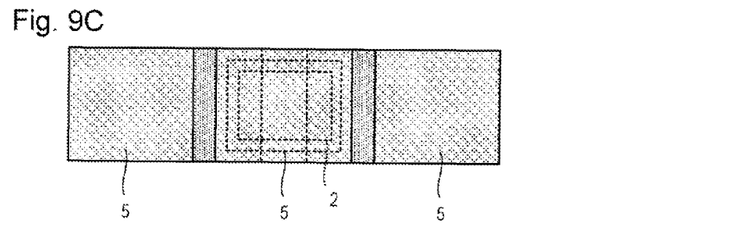
FIG. 9C is a plan view of the fifth modified device structure.

As shown in FIG. 7A, the conductive layer 12 is patterned to leave a portion of the substrate 11 uncovered along a line along the first direction 50 up to where the slot 47 will be placed (shown in chain), e.g. up to transverse line 53. A co-extensive pattern of conductive adhesive 25 is applied over the conductive layer 12. The process is then continued as described earlier. A slot 47 is cut centered on the medial and transverse lines 52, 53. As shown in FIG. 7C, the second additional layer 32 is applied having the same arrangement of windows 54, 551, 552 as described earlier. As shown in FIG. 7D, cutting the lines defines three separate contact pads.

The patterns shown in FIGS. 6A to 6C and 7A to 7D can be combined so that there are two sets of offset tracks, broken at the transverse line 53. The two sets of tacks can have the same pitch. Alternatively, the two sets of tracks can have a different pitch and thus allow different numbers of contact pads at each end.

In the examples hereinbefore described, a single component 2 is provided in a single package 1. However, more than one component can be placed in the same package. Alternatively, the process can be adapted to mount more than one component on a common substrate to form a circuit.

FIGS. 8A, 8B, 8C and 8D show selected modified steps illustrating a process for packaging or mounting two components $2_1$, $2_2$.

The process is similar to that described earlier except that two slots $47_1$, $47_2$ are provided, the slots $47_1$, $47_2$ spaced apart along the medial line 52 and each having a different transverse line 47₁, 47₂ and that the first window 54 is replaced by two windows 54₁, 54₂.

In the embodiments hereinbefore described, the slots 47 are rectangular (in plan view). However, the slot 47 need not be rectangular.

Referring to FIGS. 10A to 10F, different slot shapes 47 are shown, together with an outline 65 of a component. Preferably, the width, W, of the slot 47 is greater than the length, L, of slot 47. However, the width, W, may be the same or smaller than the length, L.

Figure 10A:
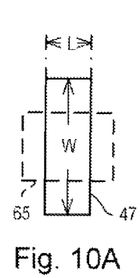
FIGS. 10A to 10G illustrate different slot structures.
Figure 10B:
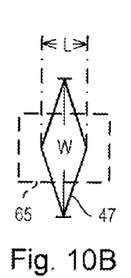
Figure 10C:
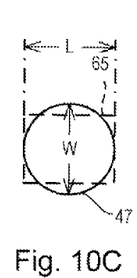
Figures 10D, 10E, 10F:
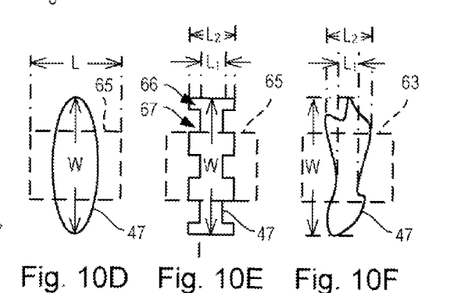

FIG. 10A shows a rectangular slot, where W>L. Other polygonal shapes can be used, such as squares, regular polygons or irregular polygons. FIG. 10B shows a diamond-shaped slot 47. FIG. 10C shows a circular slot 47, where W=L. FIG. 10D shows an elliptical slot 47, where W>L.

FIG. 10E shows a slot 47 having notches 66 and tabs 67. Thus, the slot 47 can be considered to have an inner length, $L_1$, and an outer length, $L_2$. Provided the component can be supported when bridging the contact, then $L_2 > w_c > L_1$.

FIG. 10F shows an irregularly-shaped slot 47. Similar to the slot shown in FIG. 10E, the slot can be considered to have an inner length, $L_1$, and an outer length, $L_2$.

In the examples described with reference to FIGS. 5A to 5D, 6A to 6C and 7A to 7D, longitudinal strips or tracks 12₁, 12₂ of conductive material are defined by patterning the conductive layer 12. However, an alternative to patterning the conductive layer 12 in this way is to modify the shape of the slot 47 so as to provide not only isolation between opposite ends of the packaged component, but also between opposite sides of the packaged component.

Figure 10G:
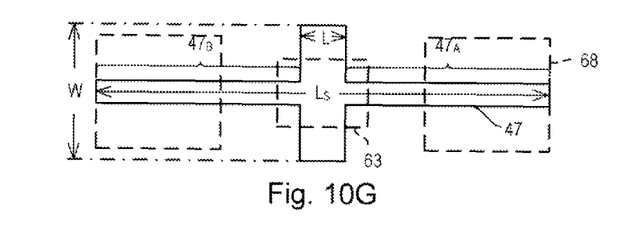

Referring to FIG. 10G, a further slot shape 47 is shown, together with an outline 65 of the component and outlines 68 of the windows in the non-conductive layer.

Referring also to FIGS. 5A to 5D, instead of patterning the conductive layer 12 as shown in FIG. 5A, a continuous layer of conductive material can be used together with a cruciform slot 47 having forwards and backwards portions 47_A, 47_B running along the length of the sheet. The portions 47_A, 47_B of the slot 47 running along the length of the sheet, i.e. in the first direction 50, are herein also referred to as "lengthwise slot extensions". The lengthwise slot extensions need not run along the entire length of the sheet only along the length, $L_D$, of the packaged component 1, e.g. $L_S \geq L_D$.

Similar slot patterns, e.g. with one or more slot extensions which may run forwards and/or backwards from the (crosswise) slot, can be used to produce the same effect as the gaps shown in FIGS. 6A to C and 7A to 7D and other similar examples.

In the examples hereinbefore described, contacts are made to the same face of the component. However, additional suitably-patterned conductive layers, conductive adhesive and/or non-conductive layers may be provided so as to contact both faces of the component. This can also be used to interconnect components.

It will be appreciated that many modifications may be made to the embodiments hereinbefore described. For example, the component 2 may take the form of an active or passive device. The component 2 may be a switch, such as a touch-sensitive switch or magnetically-activated switch. The component 2 may be a resistor, capacitor or inductor. The component 2 may be a resonator or filter. The component 2 may be a power source, such as a battery or photovoltaic cell. The component 2 may be a transducer, sensor or detector, such as a MEMS microphone or photoresistor. The component 2 may be a semiconductor component, such as diode, transistor or integrated circuit. The component 2 may comprise an assembly or module of components. The component 2 may itself be a conventionally-packaged component, such as a leadless type ceramic or plastic chip carrier. The component 2 may be rigid, such as a conventional semiconductor chip, or flexible, such as organic semiconductor circuit.

Windows in the non-conductive layers need not be rectangular.

The adhesive may be applied to the component rather than to the conductive layer.

A sheet of foil can be used instead of metallized sheet of non-conductive material.

The invention claimed is:

1. A method, comprising:
   providing a sheet comprising a conductive layer;
   forming a slot in the sheet through the conductive layer, the slot having a width in a first direction between first and second edges and length in a second, transverse direction between first and second ends;
   providing a non-conductive layer on the sheet, the non-conductive layer having at least one window including a first window having a length which is greater than the length of the slot and a width which is less than the width of the slot, the first window positioned with respect to the slot such that edges of the first window are inside the edges of the slot and ends of the first window are outside the ends of the slot;
   placing a component on the sheet within the first window so as to bridge the slot; and
   cutting through the sheet and the non-conductive layer along first and second lines outside sides of the component and within the edges the slot.

2. A method according to claim 1, wherein providing the sheet comprises providing a flexible sheet.

3. A method according to claim 1, wherein providing the sheet comprises providing a sheet of conductive material and the conductive layer is the sheet of conductive material.

4. A method according to claim 1, wherein providing the sheet comprises providing a sheet which comprises a non-conductive substrate and the conductive layer, wherein the substrate has a face and an opposite face and the conductive layer is supported on the face of the substrate, wherein forming the slot in the sheet comprises providing a slot in the sheet through the conductive layer and the non-conductive substrate, wherein providing the non-conductive layer on the sheet comprises providing the non-conductive layer on the conductive layer, wherein placing the component on the sheet comprises placing a component on the conductive layer.

5. A method according to claim 1, wherein the conductive layer comprises a metal.

6. A method according to claim 1, wherein the conductive layer is patterned.

7. A method according to claim 1, further comprising applying a conductive adhesive to the conductive layer.

8. A method according to claim 1, wherein the non-conductive layer has second and third windows, wherein the first window is disposed between the second and third windows.

9. A method according to claim 1, further comprising providing a second non-conductive layer on the non-conductive layer, wherein the second non-conductive layer covers the first window.

10. A method according to claim 1, further comprising providing a third non-conductive layer on the opposite face of the sheet, wherein the third non-conductive layer covers the slot.

11. A method according to claim 1, wherein the component is an optoelectronic component.

12. A method according to claim 1, wherein the component is a light-emitting diode chip.

13. Apparatus comprising:
- a sheet feeder or roller configured to provide a sheet comprising a conductive layer;
- a first punch, cutter or laser configured to form a slot in the sheet through the conductive layer, the slot having a width in a first direction between first and second edges and length in a second, transverse direction between first and second ends;
- a laminator configured to provide a non-conductive layer on the sheet on the conductive layer, the non-conductive layer having at least one window including a first window having a length which is greater than the length of the slot and a width which is less than the width of the slot, the first window positioned with respect to the slot such that edges of the first window are inside the edges of the slot and ends of the first window are outside the ends of the slot;
- an applicator configured to place a component on the sheet on the conductive layer within the first window so as to bridge the slot; and
- a second punch, cutter or laser configured to cut through the sheet and the non-conductive layer along first and second lines outside sides of the component and within the edges the slot.

14. Apparatus according to claim 13, wherein the apparatus includes a roll configured to support the sheet.

15. Apparatus according to claim 13, wherein the sheet feeder includes a single sheet feeder.

16. Apparatus according to claim 13, wherein the first punch, cutter, or laser comprises a rotary die cutting roller.

17. Apparatus according to claim 13, wherein the laminator comprises rollers configured to laminate the non-conductive layer and the sheet.

18. Apparatus according to claim 13, wherein the laminator comprises a carrier sheet supporting the component and rollers configured to transfer the component from the carrier sheet onto the sheet.

19. Apparatus according to claim 13, wherein the second punch, cutter or laser comprises a rotary die cutting roller.

20. Apparatus according to claim 13, wherein the applicator is a pick-and-place robot.

\* \* \* \* \*